(12) United States Patent
Uejima

(10) Patent No.: US 10,709,045 B2
(45) Date of Patent: Jul. 7, 2020

(54) HIGH FREQUENCY MODULE

(71) Applicant: Murata Manufacturing Co., Ltd., Nagaokakyo-shi, Kyoto-fu (JP)

(72) Inventor: Takanori Uejima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/127,274

(22) Filed: Sep. 11, 2018

(65) Prior Publication Data

US 2019/0014697 A1 Jan. 10, 2019

Related U.S. Application Data

(63) Continuation of application No. PCT/JP2017/008870, filed on Mar. 7, 2017.

(30) Foreign Application Priority Data

Mar. 31, 2016 (JP) ................. 2016-073220

(51) Int. Cl.
*H05K 9/00* (2006.01)
*H04B 1/04* (2006.01)
*H04B 1/38* (2015.01)
*H04B 1/525* (2015.01)
*H03H 7/46* (2006.01)
*H01L 23/552* (2006.01)
(Continued)

(52) U.S. Cl.
CPC ......... *H05K 9/0049* (2013.01); *H01L 23/552* (2013.01); *H01L 23/66* (2013.01); *H03H 7/46* (2013.01); *H04B 1/04* (2013.01); *H04B 1/0475* (2013.01); *H04B 1/38* (2013.01); *H04B 1/525* (2013.01); *H05K 9/0026* (2013.01); *H01L 23/3121* (2013.01); *H01L 2223/6644* (2013.01)

(58) Field of Classification Search
CPC .... H05K 9/0049; H05K 9/0026; H01L 23/00; H01L 23/552; H01L 23/66; H01L 2223/6644; H03H 7/46; H04B 1/04; H04B 4/38
USPC ....................................................... 333/135
See application file for complete search history.

(56) References Cited

U.S. PATENT DOCUMENTS

2007/0246825 A1* 10/2007 Oh ................. H01L 23/3121
257/728
2012/0182087 A1* 7/2012 Ye ...................... H03H 9/0571
333/133

FOREIGN PATENT DOCUMENTS

JP 2002-094410 A 3/2002
JP 3111672 U 7/2005
JP 2008-078321 A 4/2008

OTHER PUBLICATIONS

Official Communication issued in International Patent Application No. PCT/JP2017/008870, dated May 30, 2017.

* cited by examiner

*Primary Examiner* — Robert J Pascal
*Assistant Examiner* — Kimberly E Glenn
(74) *Attorney, Agent, or Firm* — Keating & Bennett, LLP

(57) ABSTRACT

A high frequency module includes an insulating substrate, a mountable element, and a shield conductor. The mountable element is mounted to a surface of the insulating substrate and includes a first mounting terminal. The shield conductor covers the mountable element in a spaced relationship to the mountable element. An exposing portion in which at least the first terminal is exposed is provided in the shield (Continued)

conductor, and a linear distance from the first terminal to the exposing portion is shorter than a linear distance from the first terminal to the shield conductor.

20 Claims, 5 Drawing Sheets

(51) Int. Cl.
*H01L 23/66* (2006.01)
*H01L 23/31* (2006.01)

HIGH FREQUENCY MODULE

CROSS REFERENCE TO RELATED APPLICATIONS

This application claims the benefit of priority to Japanese Patent Application No. 2016-073220 filed on Mar. 31, 2016 and is a Continuation Application of PCT Application No. PCT/JP2017/008870 filed on Mar. 7, 2017. The entire contents of each application are hereby incorporated herein by reference.

BACKGROUND OF THE INVENTION

1. Field of the Invention

The present invention relates to a high frequency module in which mountable elements, such as a filter circuit element and a demultiplexing circuit element, are mounted to a surface of an insulating substrate.

2. Description of the Related Art

In one example of known high frequency modules, a shield conductor for covering a mountable element is disposed in a spaced relation to the mountable element. Recently, with further size reduction and sophistication of portable electronic devices, etc., to which the high frequency modules are mounted, there has been a considerable trend to achieve smaller sizes of the high frequency modules and a higher degree of integration of elements mounted to the high frequency modules. For that reason, the mountable element has to be arranged closer to the shield conductor in many cases. Thus, the mountable element is more likely to cause capacitive coupling to the shield conductor. In other words, spurious radiation (noise) tends to propagate from the mountable element to the shield conductor, and the influence of the spurious radiation tends to reach another element through the shield conductor.

In view of the above-described situation, a technique of forming, in the shield conductor, a slit to prevent propagation of the spurious radiation to another element from the mountable element, which generates the spurious radiation, is proposed with the intent of preventing the propagation of the spurious radiation to the other element through the shield conductor (see, e.g., Japanese Unexamined Patent Application Publication No. 2008-78321).

However, Japanese Unexamined Patent Application Publication No. 2008-78321 has a problem in that the spurious radiation reaches the other element while bypassing the slit because the spurious radiation propagates to the shield conductor from the mountable element.

SUMMARY OF THE INVENTION

Preferred embodiments of the present invention provide high frequency modules in which propagation of spurious radiation between a mountable element and a shield conductor is prevented.

A high frequency module according to a preferred embodiment of the present invention includes an insulating substrate, a mountable element, and a shield conductor. The mountable element is mounted to a surface of the insulating substrate and includes a first terminal for mounting. The shield conductor covers the mountable element in a spaced relationship to the mountable element. An exposing portion that exposes at least the first terminal is provided in the shield conductor, and a linear distance from the first terminal to the exposing portion is shorter than a linear distance from the first terminal to the shield conductor. Here, the linear distance from the first terminal to the exposing portion is the shortest distance from the first terminal to the exposing portion. The linear distance from the first terminal to the shield conductor is the shortest distance from the first terminal to the shield conductor.

With the high frequency module described above, since the shield conductor is not overlapped with the first terminal, capacitive coupling is less likely to occur between the shield conductor and the first terminal. In other words, propagation of spurious radiation between the first terminal and the shield conductor is less likely to be generated.

In a high frequency module according to a preferred embodiment of the present invention, the mountable element may be a filter circuit element including a transmission terminal. In such a case, the first terminal is preferably the transmission terminal. The filter circuit element tends to generate spurious radiation. Therefore, the above-described configuration of the high frequency module is preferably applied to the high frequency module, which includes the filter circuit element having the above-described properties, from the viewpoint of preventing the propagation of the spurious radiation between the first terminal and the shield conductor.

In a high frequency module according to a preferred embodiment of the present invention, the mountable element may be a demultiplexing circuit element including a transmission terminal and a reception terminal. In such a case, the first terminal is preferably one of the transmission terminal and the reception terminal. The demultiplexing circuit element tends to generate spurious radiation. Therefore, the above-described configuration of the high frequency module is preferably applied to the high frequency module, which includes the demultiplexing circuit element having the above-described properties, from the viewpoint of preventing the propagation of the spurious radiation to the shield conductor.

In a high frequency module according to a preferred embodiment of the present invention, the exposing portion is preferably overlapped with the first terminal when viewed from the front. With this feature, the propagation of the spurious radiation between the first terminal and the shield conductor is even less likely to be generated.

In a high frequency module according to a preferred embodiment of the present invention, the mountable element further includes a second terminal for mounting, and the exposing portion is overlapped with both of the first terminal and the second terminal when viewed from the front.

With the above-described features, since the shield conductor is not overlapped with both of the first terminal and the second terminal, capacitive coupling is less likely to occur between the shield conductor and each of the first terminal and the second terminal. In other words, the propagation of the spurious radiation is less likely to be generated between the shield conductor and the second terminal as well. As a result, the propagation of the spurious radiation through the shield conductor is prevented between the first terminal and the second terminal with high efficiency.

In a high frequency module according to a preferred embodiment of the present invention, the mountable element may be a filter circuit element including a common terminal. In such a case, the second terminal is preferably the common terminal. With these features, the propagation of the spurious radiation through the shield conductor is prevented between the terminals of the filter circuit element with high efficiency. Thus, high isolation characteristics are achieved between those terminals.

In a high frequency module according to a preferred embodiment of the present invention, the mountable element may be a demultiplexing circuit element including a transmission terminal, a reception terminal, and a common terminal. In such a case, the first terminal and the second terminal are preferably any two among the transmission terminal, the reception terminal, and the common terminal. With these features, the propagation of the spurious radiation through the shield conductor is prevented between the terminals of the demultiplexing circuit element with high efficiency. Thus, high isolation characteristics are realized between those terminals.

In a high frequency module according to a preferred embodiment of the present invention, the exposing portion is further overlapped with an element body of the mountable element when viewed from the front. With this feature, the propagation of the spurious radiation between the shield conductor and the element body is also less likely to be generated.

In a high frequency module according to a preferred embodiment of the present invention, the exposing portion is an opening or a slit provided in the shield conductor. With this feature, the exposing portion is able to be easily formed, for example, by masking a region at which the opening or the slit is to be provided, when the shield conductor is provided.

In a high frequency module according to a preferred embodiment of the present invention, the mountable element is mounted in at least two of the insulating substrate, the plurality of mountable elements being covered with the shield conductor, and the exposing portion is provided in at least two of the shield conductors corresponding to the plurality of mountable elements respectively.

With these features, the propagation of the spurious radiation between each of the mountable elements and the shield conductor is less likely to be generated. Accordingly, the propagation of the spurious radiation through the shield conductor is less likely to be generated between the terminals in each of the mountable elements. In addition, the propagation of the spurious radiation through the shield conductor is also less likely to be generated between the mountable elements.

With the high frequency modules according to preferred embodiments of the present invention, the spurious radiation is able to be prevented from propagating between the mountable element and the shield conductor.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings.

First Preferred Embodiment

Figure 1A:
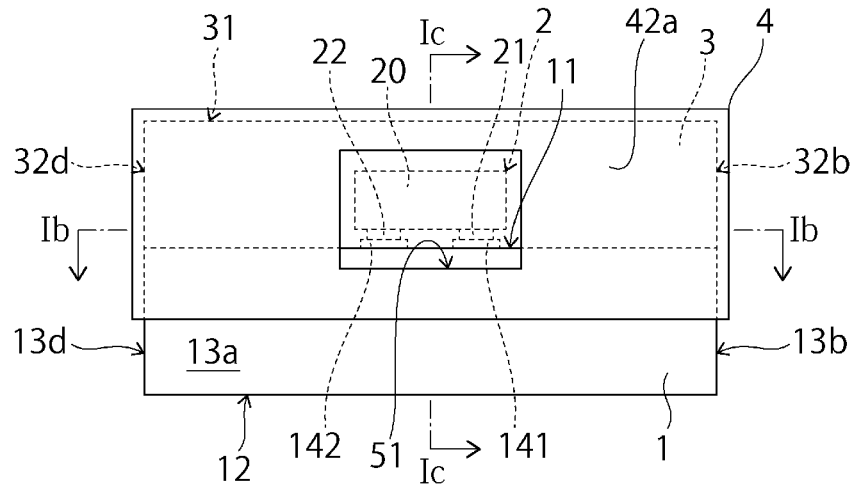
FIG. 1A is a conceptual front view of a high frequency module according to a first preferred embodiment of the present invention.
Figure 1B:
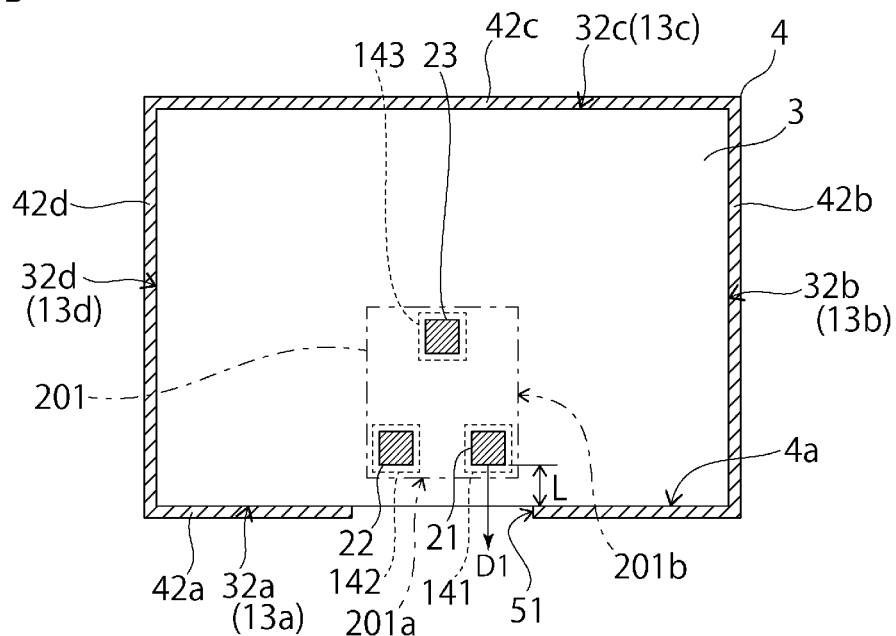
FIG. 1B is a horizontal sectional view taken along a line Ib-Ib in FIG. 1A.
Figure 1C:
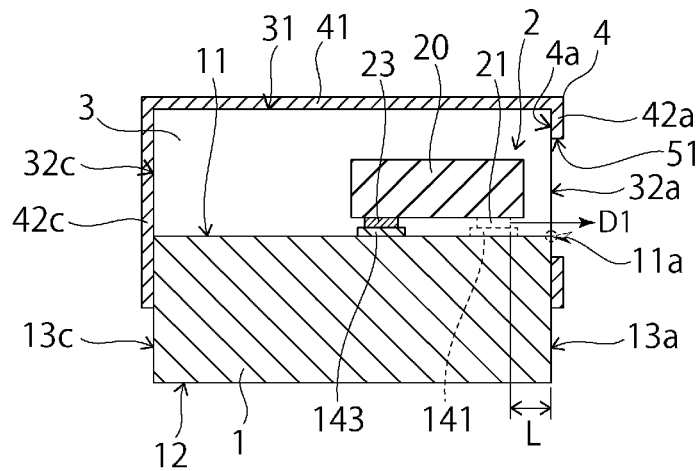
FIG. 1C is a vertical sectional view taken along a line Ic-Ic in FIG. 1A.

FIG. 1A is a conceptual front view of a high frequency module according to a first preferred embodiment of the present invention when looking at the high frequency module from the front. FIG. 1B is a horizontal sectional view taken along a line Ib-Ib in FIG. 1A when looking at the horizontal section from above. FIG. 1C is a vertical sectional view taken along a line Ic-Ic in FIG. 1A. As illustrated in FIGS. 1A to 1C, the high frequency module includes an insulating substrate 1, a mountable element 2, a molded resin 3, and a shield conductor 4.

The insulating substrate 1 is preferably a multilayer substrate including a plurality of laminated dielectric layers. In the present preferred embodiment, the insulating substrate 1 preferably has a rectangular or substantially rectangular parallelepiped shape, for example. The insulating substrate 1 includes a mounting surface 11, i.e., a front surface of the insulating substrate 1, to which the mountable element 2 is mounted, a rear surface 12 positioned on a side opposite to the mounting surface 11, and four lateral surfaces 13a to 13d interconnecting the mounting surface 11 and the rear surface 12. In one example, the insulating substrate 1 preferably includes a plurality of dielectric layers having a rectangular or substantially rectangular shape and the same or substantially the same size that are laminated, and the mounting surface 11 and the rear surface 12 are opposed to each other in a lamination direction of the dielectric layers. It is to be noted that the insulating substrate 1 is not limited to the multilayer substrate.

Three land conductors 141 to 143 for mounting are provided on the mounting surface 11 of the insulating substrate 1 at positions at which a transmission terminal 21, a reception terminal 22, and a common terminal 23 of the mountable element 2 are to be provided (see FIG. 1B).

In the present preferred embodiment, the land conductors 141 and 142 are disposed at positions near one lateral surface 13a of the four lateral surfaces 13a to 13d, while the land conductor 143 is disposed at a position spaced apart from the lateral surface 13a. More specifically, the mounting surface 11 includes four outer edges, and the land conductors 141 and 142 are disposed near one edge 11a (see FIG. 1C) of the four edges, the edge 11a being positioned on the same side as the lateral surface 13a, side by side along the edge 11a. The common terminal 23 is spaced away from the edge 11a.

Here, the expression "near the lateral surface 13a" includes the meaning that the distance from the lateral surface 13a is minimal among the distances from the four lateral surfaces 13a to 13d when viewed in a direction perpendicular or substantially perpendicular to the mounting surface 11 (see FIG. 1B). Furthermore, the expression "near the edge 11a" includes the meaning that the distance from the edge 11a is minimal among the distances from the four edges, i.e., the outer edges, of the mounting surface 11 when viewed in the direction perpendicular or substantially perpendicular to the mounting surface 11. The above points are similarly applied to the following description as well.

The layout of the land conductors 141 to 143 is not limited to the above-described layout, and it may be variously modified depending on, for example, an orientation of the mountable element 2 as in a fifth preferred embodiment of the present invention described later, and on positions at which the terminals of the mountable element 2 are provided.

The mountable element 2 is preferably a demultiplexing circuit element, for example, and a demultiplexing circuit is provided in an element body 20. The demultiplexing circuit includes a transmission (Tx) filter and a reception (Rx) filter. The transmission terminal 21, the reception terminal 22, and the common terminal 23 are provided on a rear surface 201 of the element body 20. Here, the rear surface 201 of the element body 20 faces the mounting surface 11 of the insulating substrate 1, and is denoted by a one-dot-chain line in FIG. 1B. The transmission (Tx) filter is connected between the transmission terminal 21 and the common terminal 23, and the reception (Rx) filter is connected between the reception terminal 22 and the common terminal 23. The terminals provided on the rear surface 201 may be flat-plate electrodes or bumps (prominent electrodes), for example.

In the present preferred embodiment, the rear surface 201 of the element body 20 preferably has a rectangular or substantially rectangular shape and includes four outer edges thereof. The transmission terminal 21 and the reception terminal 22 are arranged near one edge 201a (see FIG. 1C) of the four edges side by side along the edge 201a. The common terminal 23 is spaced away from the edge 201a. Furthermore, an orientation of the mountable element 2 is specified as follows. Thus, the mountable element 2 is oriented such that, near the edge 11a of the mounting surface 11, the edge 201a of the rear surface 201 is parallel or substantially parallel to the edge 11a.

The transmission terminal 21, the reception terminal 22, and the common terminal 23 are bonded to the land conductors 141 to 143, respectively, such that the mountable element 2 is mounted to the insulating substrate 1. Accordingly, the transmission terminal 21 and the reception terminal 22 are disposed at the positions near the lateral surface 13a, while the common terminal 23 is spaced away from the lateral surface 13a. More specifically, the transmission terminal 21 and the reception terminal 22 are disposed near the edge 11a of the mounting surface 11 side by side along the edge 11a, while the common terminal 23 is spaced away from the edge 11a. In addition, the entirety or substantially the entirety of the mountable element 2 (i.e., the element body 20) is disposed near the lateral surface 13a.

In the present preferred embodiment, the transmission terminal 21 and the reception terminal 22 correspond respectively to a "first terminal" and a "second terminal".

The molded resin 3 covers not only the entirety or substantially the entirety of the mounting surface 11 of the insulating substrate 1, but also the entirety or substantially the entirety of the mountable element 2. More specifically, preferably, the molded resin 3 is structured such that a horizontal cross-section (see FIG. 1B) has the same or substantially the same shape as the shape (rectangular) of the mounting surface 11. Thus, the molded resin 3 includes four lateral surfaces 32a to 32d that are substantially flush with the lateral surfaces 13a to 13d of the insulating substrate 1, respectively. Moreover, in the present embodiment, a top surface 31 (see FIG. 1C) of the molded resin 3 is parallel or substantially parallel to the mounting surface 11 of the insulating substrate 1.

Stated in another way, the transmission terminal 21 and the reception terminal 22 are positioned as follows. The transmission terminal 21 and the reception terminal 22 are disposed at the positions near a lateral surface 32a of the molded resin 3, the lateral surface 32a being flush or substantially flush with the lateral surface 13a of the insulating substrate 1. Furthermore, the entirety or substantially the entirety of the mountable element 2 (i.e., the element body 20) is disposed near the lateral surface 32a.

Here, the expression "near the lateral surface 32a" includes the meaning that the distance from the lateral surface 32a is minimal among the distances from the four lateral surfaces 32a to 32d when viewed in the direction perpendicular or substantially perpendicular to the mounting surface 11 (see FIG. 1B). A comparison target of the distance meant by the above expression may further include a distance from the top surface 31 of the molded resin 3.

The shield conductor 4 covers the mountable element 2 in a spaced relationship to the mountable element 2. More specifically, the shield conductor 4 includes a top portion 41 (see FIG. 1C) covering the top surface 31 of the molded resin 3, and lateral portions 42a to 42d (see FIG. 1B) covering respectively the lateral surfaces 32a to 32d of the molded resin 3. In the present preferred embodiment, as illustrated in FIG. 1C, the lateral portions 42a to 42d further partially cover the lateral surfaces 13a to 13d of the insulating substrate 1, respectively.

In an example, the shield conductor 4 is preferably made of a conductive material, such as silver (Ag), for example, by spin coating, sputtering, or another suitable formation method. The shield conductor 4 may be connected to a ground electrode (not illustrated) provided on or in the insulating substrate 1.

As described above, the transmission terminal 21 and the reception terminal 22 are disposed at the positions near the lateral surface 32a of the molded resin 3, and the entirety or substantially the entirety of the mountable element 2 (i.e., the element body 20) is disposed near the lateral surface 32a. Accordingly, the transmission terminal 21 and the reception terminal 22 are disposed at the positions near the lateral portion 42a covering the lateral surface 32a of the molded resin 3, and the entirety or substantially the entirety of the mountable element 2 (i.e., the element body 20) is disposed near the lateral portion 42a.

Here, the expression "near the lateral portion 42a" includes the meaning that the distance from the lateral portion 42a is minimal among the distances from the four lateral portions 42a to 42d when viewed in the direction perpendicular or substantially perpendicular to the mounting surface 11 (see FIG. 1B). A comparison target of the distance meant by the above expression may further include a distance from the top portion 41 of the shield conductor 4. The above point is similarly applied to the following description as well.

In the above-described structure, if the lateral portion 42*a* of the shield conductor 4 entirely covers the lateral surface 32*a* of the molded resin 3, capacitive coupling is more likely to occur between the lateral portion 42*a* and each of the transmission terminal 21 and the reception terminal 22. In other words, propagation of spurious radiation (mainly a leakage signal from the transmission terminal 21) through the shield conductor 4 is more likely to be generated between the transmission terminal 21 and the reception terminal 22. In addition, when another mountable element is mounted to the mounting surface 11, propagation of the spurious radiation through the shield conductor 4 is even more likely to be generated between the other mountable element and the mountable element 2. The above-described propagation of the spurious radiation deteriorates, in the high frequency module, isolation characteristics between the transmission terminal 21 and the reception terminal 22, and isolation characteristics between the mountable elements.

In the present preferred embodiment, an opening 51 is provided in the lateral portion 42*a* of the shield conductor 4 to ensure that the lateral portion 42*a* is not overlapped with the mountable element 2 when viewed from a predetermined direction D1 (i.e., from the front, see FIG. 1A). In other words, when viewed from the predetermined direction D1 (i.e., from the front), the opening 51 is structured such that the lateral portion 42*a* of the shield conductor 4 does not overlap with any of the transmission terminal 21 and the reception terminal 22, and with the element body 20 of the mountable element 2. Stated in another way, when viewed from the predetermined direction D1 (i.e., from the front), the opening 51 is overlapped with each of the transmission terminal 21 and the reception terminal 22, and with the element body 20 of the mountable element 2.

Here, the predetermined direction D1 is defined as follows. Assume first an imaginary surface that extends along an inner surface 4*a* of the shield conductor 4 and includes the inner surface 4*a*. In the present preferred embodiment, the imaginary surface includes the top surface 31*a* and the lateral surfaces 32*a* to 32*d* of the molded resin 3. Assuming the above imaginary surface, the predetermined direction D1 is defined as a direction starting from one of the transmission terminal 21 and the reception terminal 22 and providing a minimum distance L from the one terminal to the imaginary surface when viewed in that direction (see FIGS. 1B and 1C). In the present preferred embodiment, the predetermined direction D1 is defined as a direction starting from one of the transmission terminal 21 and the reception terminal 22 and being perpendicular or substantially perpendicular to the lateral surface 32*a* of the molded resin 3 on which the lateral portion 42*a* of the shield conductor 4 is provided.

The shield conductor 4 and the opening 51 may be understood as follows. A linear distance from one of the transmission terminal 21 and the reception terminal 22 to the opening 51 is shorter than that from the one terminal to the shield conductor 4. Here, the linear distance from the one terminal to the opening 51 is the shortest distance from the one terminal to the opening 51. The linear distance from the one terminal to the shield conductor 4 is the shortest distance from the one terminal to the shield conductor 4.

In an example, the opening 51 is preferably formed by masking a partial region in the lateral surface 32*a* of the molded resin 3 at which the opening 51 is to be formed, when the shield conductor 4 is formed.

In the present preferred embodiment, the opening 51 corresponds to an "exposing portion".

With the high frequency module described above, since the lateral portion 42*a* of the shield conductor 4 is not overlapped with any of the transmission terminal 21 and the reception terminal 22, capacitive coupling is less likely to occur between the lateral portion 42*a* and each of the transmission terminal 21 and the reception terminal 22. Here, the expression "capacitive coupling is less likely to occur" includes the meaning that, even if capacitive coupling occurs, the capacitive coupling is only at a negligible level from the viewpoint of electrical characteristics. The above point is similarly applied to the following description.

In other words, the propagation of the spurious radiation is less likely to be generated not only between the transmission terminal 21 tending to generate the spurious radiation and the shield conductor 4, but also between the reception terminal 22 being susceptible to the influence of the spurious radiation and the shield conductor 4.

Thus, with the high frequency module according to the first preferred embodiment, the propagation of the spurious radiation is less likely to be generated between the mountable element 2 and the shield conductor 4. As a result, the propagation of the spurious radiation through the shield conductor 4 is reduced or prevented with high efficiency. More specifically, the propagation of the spurious radiation (mainly the leakage signal from the transmission terminal 21) through the shield conductor 4 is less likely to be generated between the transmission terminal 21 and the reception terminal 22. Furthermore, since the propagation of the spurious radiation to the shield conductor 4 is less likely to be generated, the propagation of the spurious radiation through the shield conductor 4 is additionally less likely to be generated between another mountable element mounted to the mounting surface 11 and the mountable element 2.

Moreover, in the present preferred embodiment, the lateral portion 42*a* of the shield conductor 4 is not overlapped with the element body 20 of the mountable element 2 as well. Thus, propagation of the spurious radiation between the shield conductor 4 and the element body 20 is also less likely to be generated.

With the high frequency module according to the first preferred embodiment, as described above, the propagation of the spurious radiation through the shield conductor 4 is reduced or prevented with high efficiency. As a result, high isolation characteristics are achieved in the high frequency module.

Second Preferred Embodiment

Figure 2:
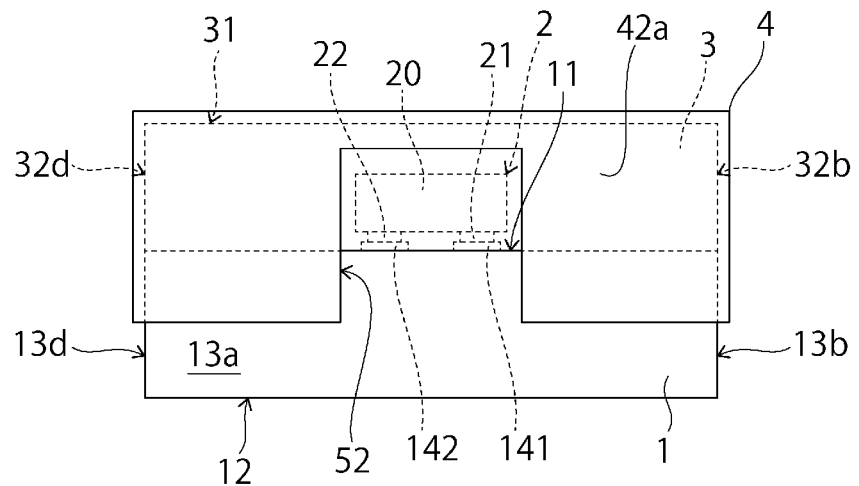
FIG. 2 is a conceptual front view of a high frequency module according to a second preferred embodiment of the present invention.

FIG. 2 is a conceptual front view of a high frequency module according to a second preferred embodiment of the present invention when looking at the high frequency module from the front. As described below, the exposing portion in preferred embodiments of the present invention is not limited to the opening 51 described in the first preferred embodiment, and it may be variously modified.

As illustrated in FIG. 2, a slit 52 may be provided as the exposing portion in the lateral portion 42*a* of the shield conductor 4 to ensure that the lateral portion 42*a* is not overlapped with the mountable element 2 when viewed from the predetermined direction D1 (see FIGS. 1B and 1C) (i.e., from the front). In other words, the slit 52 is overlapped with the mountable element 2 when viewed from the predetermined direction D1 (i.e., from the front).

According to the above-described structure, as in the first preferred embodiment, the propagation of the spurious radiation through the shield conductor 4 is reduced or prevented with high efficiency.

Third Preferred Embodiment

Figure 3A:
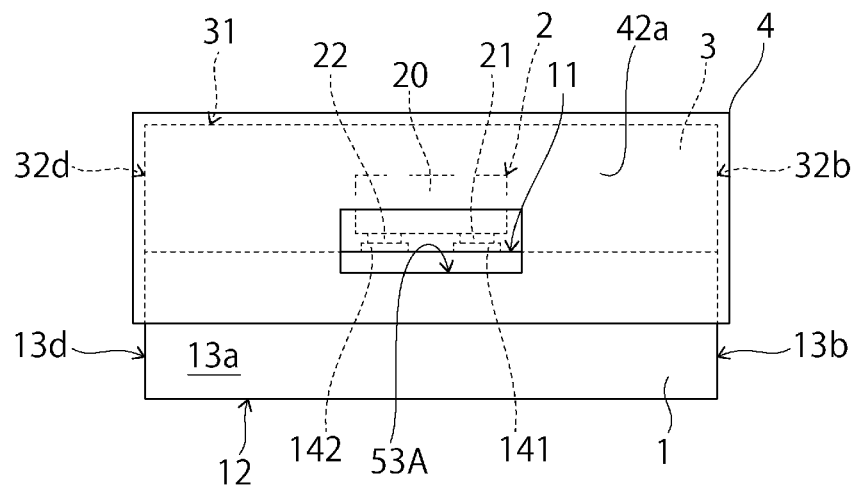
FIGS. 3A and 3B are conceptual front views illustrating two examples of a high frequency module according to a third preferred embodiment of the present invention.
Figure 3B:
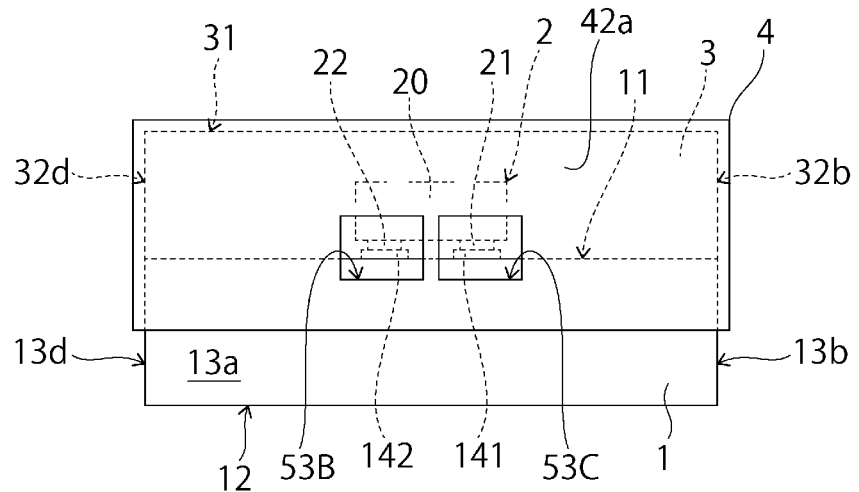

FIGS. 3A and 3B are conceptual front views illustrating two examples of a high frequency module according to a third preferred embodiment of the present invention. As described below, the exposing portion in preferred embodiments of the present invention is not limited to the opening and the slit described in the first and second preferred embodiments, and it may be variously modified.

As illustrated in FIG. 3A, an opening 53A described below may be provided as the exposing portion in the lateral portion 42a of the shield conductor 4. The opening 53A is structured such that the lateral portion 42a of the shield conductor 4 is not overlapped with any of the transmission terminal 21 and the reception terminal 22, while the lateral portion 42a is overlapped with the element body 20. In other words, the opening 53A is overlapped with each of the transmission terminal 21 and the reception terminal 22, but not overlapped with the element body 20.

According to the above-described structure, the propagation of the spurious radiation is less likely to be generated not only between the transmission terminal 21 tending to generate the spurious radiation and the shield conductor 4, but also between the reception terminal 22 being susceptible to the influence of the spurious radiation and the shield conductor 4. Thus, as in the first preferred embodiment, the propagation of the spurious radiation is less likely to be generated between the mountable element 2 and the shield conductor 4. As a result, the propagation of the spurious radiation through the shield conductor 4 is reduced or prevented with high efficiency.

In addition, according to the above-described structure, since the lateral portion 42a of the shield conductor 4 is overlapped with the element body 20, leakage of the spurious radiation to the outside is effectively reduced or prevented.

As illustrated in FIG. 3B, openings 53B and 53C described below may be provided as the exposing portion in the lateral portion 42a of the shield conductor 4. The opening 53B is structured such that the lateral portion 42a of the shield conductor 4 is not overlapped with the transmission terminal 21, while allowing the lateral portion 42a to be overlapped with the element body 20. The opening 53C is structured such that the lateral portion 42a of the shield conductor 4 is not overlapped with the reception terminal 22, while allowing the lateral portion 42a to be overlapped with the element body 20.

In other words, the opening 53B is overlapped with the transmission terminal 21, but not overlapped with the reception terminal 22 and the element body 20. The opening 53C is overlapped with the reception terminal 22, but not overlapped with the transmission terminal 21 and the element body 20

According to the above-described structure, as in the structure illustrated in FIG. 3A, the propagation of the spurious radiation is less likely to be generated not only between the transmission terminal 21 tending to generate the spurious radiation and the shield conductor 4, but also between the reception terminal 22 being susceptible to the influence of the spurious radiation and the shield conductor 4. In addition, leakage of the spurious radiation to the outside is effectively reduced or prevented.

Fourth Preferred Embodiment

Figure 4A:
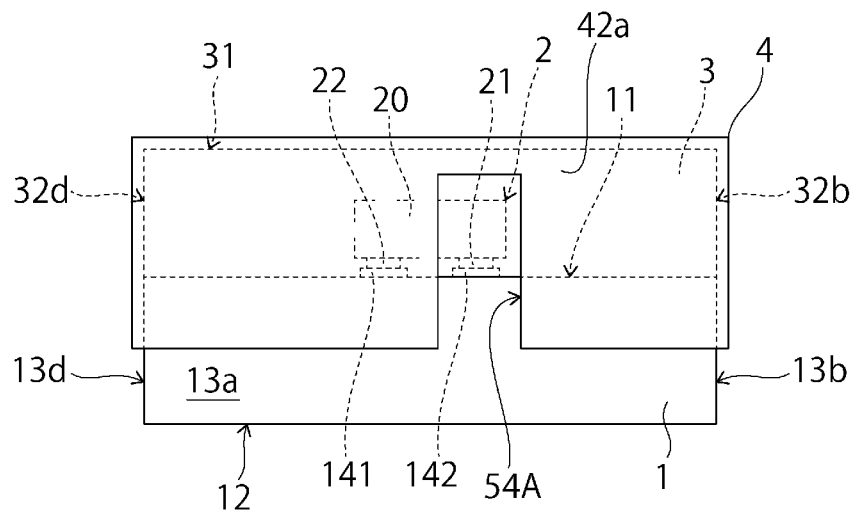
FIGS. 4A to 4C are conceptual front views illustrating three examples of a high frequency module according to a fourth preferred embodiment of the present invention.
Figure 4B:
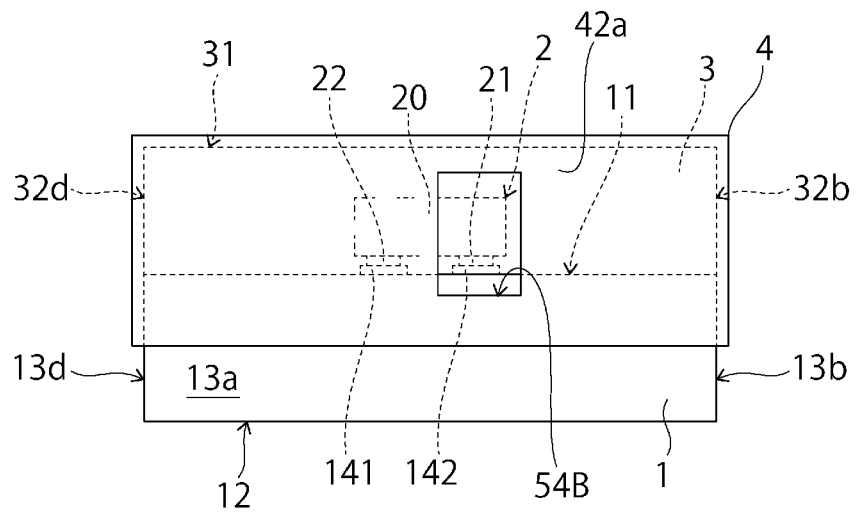
Figure 4C:
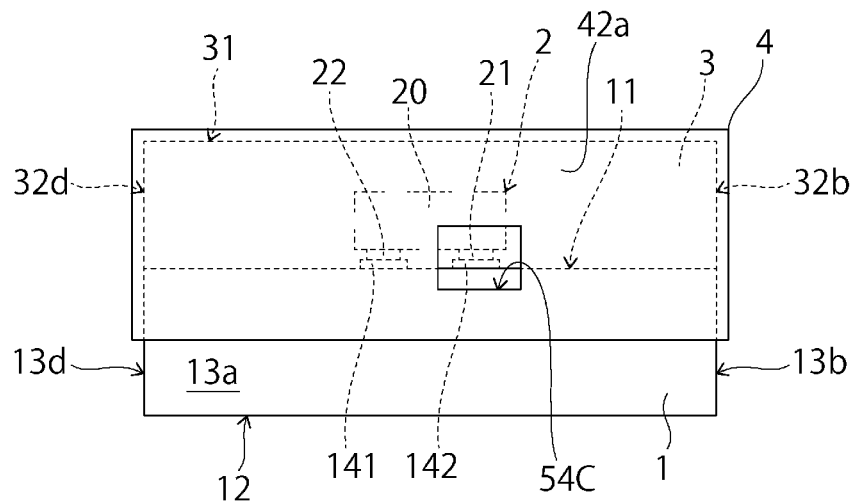

FIGS. 4A to 4C are conceptual front views illustrating three examples of a high frequency module according to a fourth preferred embodiment of the present invention. The exposing portion in preferred embodiments of the present invention may be structured such that the lateral portion 42a of the shield conductor 4 is not overlapped with one of the transmission terminal 21 and the reception terminal 22, while allowing the lateral portion 42a to be overlapped with the other terminal. Detail of the exposing portion in the present preferred embodiment is as follows.

As illustrated in FIGS. 4A and 4B, a slit 54A or an opening 54B each described below may be provided as the exposing portion in the lateral portion 42a of the shield conductor 4. When viewed from the predetermined direction D1 (see FIGS. 1B and 1C) (i.e., from the front), the slit 54A and the opening 54B are each structured such that the lateral portion 42a of the shield conductor 4 is not overlapped with not only the transmission terminal 21, but also with a portion of the element body 20, the portion being positioned above the transmission terminal 21. In other words, when viewed from the predetermined direction D1 (i.e., from the front), the slit 54A and the opening 54B are each overlapped with both the transmission terminal 21 and the portion of the element body 20, which is positioned above the transmission terminal 21.

According to the above-described structure, the propagation of the spurious radiation is less likely to be generated between the transmission terminal 21 tending to generate the spurious radiation and the shield conductor 4. In other words, the spurious radiation is less likely to propagate from the transmission terminal 21 to the shield conductor 4. As a result, the propagation of the spurious radiation through the shield conductor 4 is less likely to be generated between the transmission terminal 21 and the reception terminal 22. Furthermore, since the propagation of the spurious radiation to the shield conductor 4 is less likely to be generated, the propagation of the spurious radiation through the shield conductor 4 is additionally less likely to be generated between another mountable element mounted to the mounting surface 11 and the mountable element 2. Moreover, the propagation of the spurious radiation is less likely to be generated between the shield conductor 4 and a portion of the element body 20, the portion being not overlapped with the lateral portion 42a of the shield conductor 4. Thus, according to the above-described structure, the propagation of the spurious radiation through the shield conductor 4 is reduced or prevented with high efficiency.

In addition, according to the above-described structure, since the lateral portion 42a of the shield conductor 4 is partially overlapped with the element body 20, leakage of the spurious radiation to the outside is effectively reduced or prevented.

As illustrated in FIG. 4C, an opening 54C described below may be provided as the exposing portion in the lateral portion 42a of the shield conductor 4. When viewed from the predetermined direction D1 (see FIGS. 1B and 1C) (i.e., from the front), the opening 54C is structured such that the lateral portion 42a of the shield conductor 4 is not overlapped with the transmission terminal 21, while allowing the lateral portion 42a to be overlapped with the element body 20. In other words, when viewed from the predetermined direction D1 (i.e., from the front), the opening 54C is overlapped with the transmission terminal 21, but not overlapped with the reception terminal 22 and the element body 20.

According to the above-described structure, the propagation of the spurious radiation is less likely to be generated between the transmission terminal 21 tending to generate the spurious radiation and the shield conductor 4. In addition, leakage of the spurious radiation to the outside is effectively reduced or prevented.

Fifth Preferred Embodiment

Figure 5A:
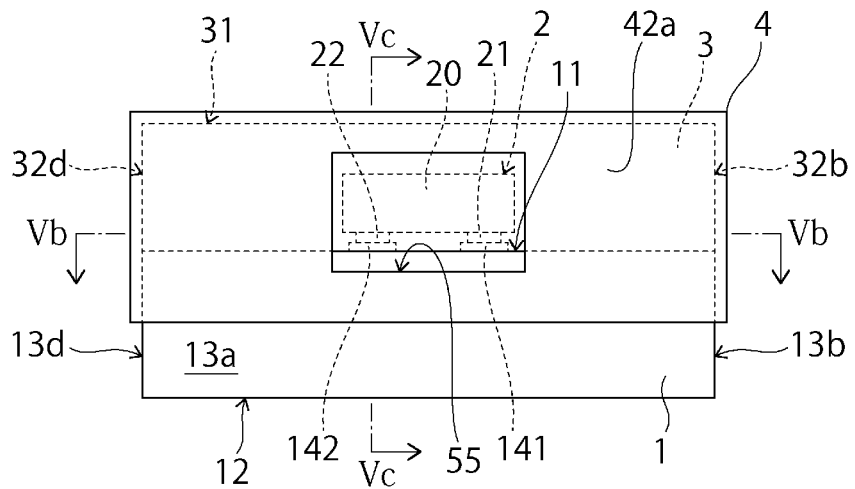
FIG. 5A is a conceptual front view of a high frequency module according to a fifth preferred embodiment of the present invention.
Figure 5B:
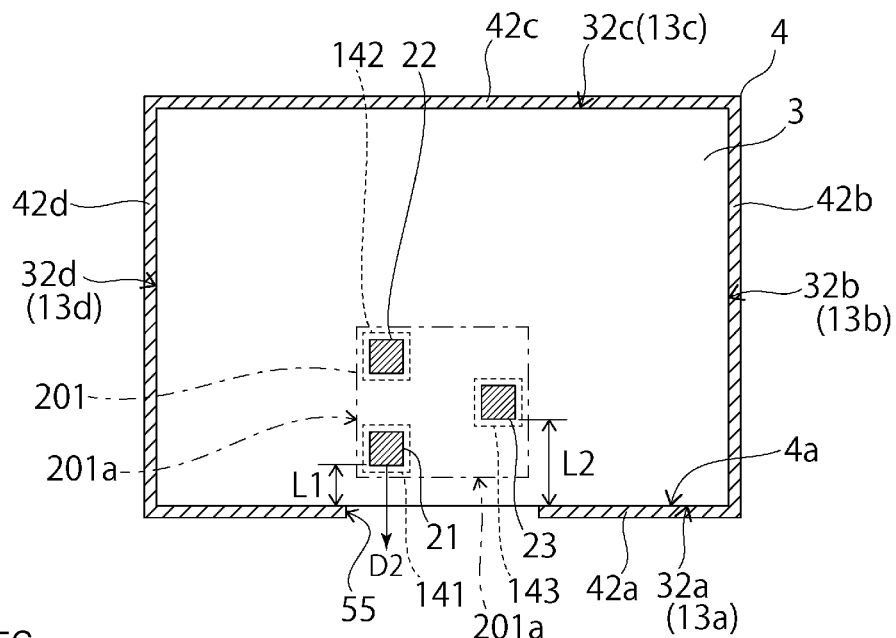
FIG. 5B is a horizontal sectional view taken along a line Vb-Vb in FIG. 5A.
Figure 5C:
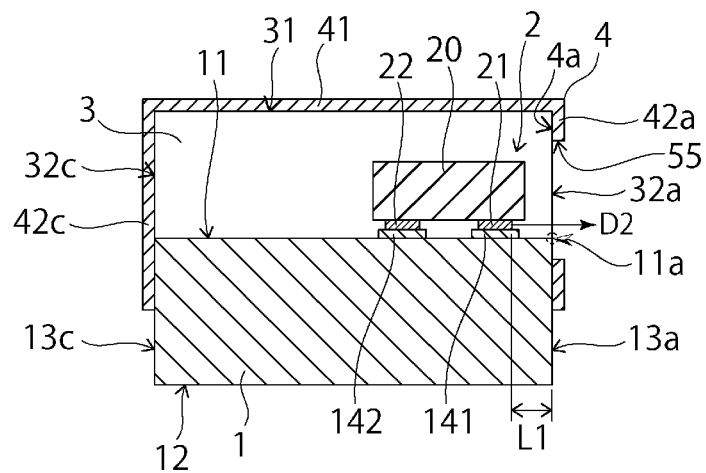
FIG. 5C is a vertical sectional view taken along a line Vc-Vc in FIG. 5A.

FIG. 5A is a conceptual front view of a high frequency module according to a fifth preferred embodiment of the present invention. FIG. 5B is a horizontal sectional view taken along a line Vb-Vb in FIG. 5A, and FIG. 5C is a vertical sectional view taken along a line Vc-Vc in FIG. 5A. As illustrated in FIGS. 5A to 5C, an orientation of the mountable element 2 mounted to the mounting surface 11 of the insulating substrate 1 may be different from that in the high frequency module according to the first preferred embodiment.

More specifically, in the present preferred embodiment, the orientation of the mountable element 2 is specified as follows. The orientation of the mountable element 2 is specified such that, near the edge 11a of the mounting surface 11, one 201b of the four edges of the rear surface 201 of the element body 20 is parallel or substantially parallel to the edge 11a. Here, the edge 201b is an edge extending perpendicular or substantially perpendicular to the edge 201a. Moreover, the land conductors 141 to 143 are provided at positions at which the transmission terminal 21, the reception terminal 22, and the common terminal 23 are to be disposed, respectively, those positions being dependent on the orientation of the mountable element 2.

Because of the mountable element 2 having the above-described orientation, the transmission terminal 21 and the common terminal 23 are disposed at positions near the lateral portion 42a of the shield conductor 4. In addition, the entirety or substantially the entirety of the mountable element 2 (i.e., the element body 20) is disposed near the lateral portion 42a.

In the present preferred embodiment, the transmission terminal 21 and the common terminal 23 correspond respectively to the "first terminal" and the "second terminal".

Furthermore, in the present preferred embodiment, an opening 55 is provided as the exposing portion in the lateral portion 42a of the shield conductor 4 such that the lateral portion 42a is not overlapped with the mountable element 2 when viewed from a predetermined direction D2 (i.e., from the front, see FIG. 5A). Thus, when viewed from the predetermined direction D2 (i.e., from the front), the opening 55 is structured such that the lateral portion 42a of the shield conductor 4 is not overlapped with not only both the transmission terminal 21 and the common terminal 23, but also with the element body 20 of the mountable element 2. In other words, when viewed from the predetermined direction D2 (i.e., from the front), the opening 55 is overlapped with both the transmission terminal 21 and the common terminal 23, as well as with the element body 20 of the mountable element 2.

Here, the predetermined direction D2 is defined as follows. Assuming an imaginary surface similar to that assumed in the first preferred embodiment, the predetermined direction D2 is defined as a direction starting from one of the transmission terminal 21 and the common terminal 23 and providing a minimum distance L1 (or L2) from the one terminal to the imaginary surface when viewed in that direction (see FIGS. 5B and 5C). In the present embodiment, the predetermined direction D2 is defined as a direction starting from the transmission terminal 21 and being perpendicular or substantially perpendicular to the lateral surface 32a of the molded resin 3 at which the lateral portion 42a of the shield conductor 4 is provided.

The shield conductor 4 and the opening 55 described above may be understood as follows. A linear distance from one of the transmission terminal 21 and the common terminal 23 to the opening 55 is shorter than that from the one terminal to the shield conductor 4. Here, the linear distance from the one terminal to the opening 55 is the shortest distance from the one terminal to the opening 55. The linear distance from the one terminal to the shield conductor 4 is the shortest distance from the one terminal to the shield conductor 4.

According to the above-described high frequency module, since the lateral portion 42a of the shield conductor 4 is not overlapped with any of the transmission terminal 21 and the common terminal 23, capacitive coupling is less likely to occur between the lateral portion 42a and each of the transmission terminal 21 and the common terminal 23. In other words, the propagation of the spurious radiation is less likely to be generated not only between the transmission terminal 21 tending to generate the spurious radiation and the shield conductor 4, but also between the common terminal 23 being susceptible to the influence of the spurious radiation and the shield conductor 4.

Thus, with the high frequency module according to the fifth preferred embodiment, the propagation of the spurious radiation is less likely to be generated between the mountable element 2 and the shield conductor 4 as in the first preferred embodiment. As a result, the propagation of the spurious radiation through the shield conductor 4 is reduced or prevented with high efficiency. More specifically, the propagation of the spurious radiation (mainly the leakage signal from the transmission terminal 21) through the shield conductor 4 is less likely to be generated between the transmission terminal 21 and the common terminal 23. Furthermore, since the propagation of the spurious radiation to the shield conductor 4 is less likely to be generated, the propagation of the spurious radiation through the shield conductor 4 is additionally less likely to be generated between another mountable element mounted to the mounting surface 11 and the mountable element 2.

Moreover, in the present preferred embodiment, the lateral portion 42a of the shield conductor 4 is not overlapped with the element body 20 of the mountable element 2 as well. Thus, propagation of the spurious radiation between the shield conductor 4 and the element body 20 is also less likely to be generated.

With the high frequency module according to the fifth preferred embodiment, as described above, the propagation of the spurious radiation through the shield conductor 4 is reduced or prevented with high efficiency. As a result, high isolation characteristics are achieved in the high frequency module.

The orientation of the mountable element 2 is not limited to the examples described in the first preferred embodiment and the fifth preferred embodiment, and it may be variously modified. Moreover, in the high frequency module according to the fifth preferred embodiment, the opening 55 defining the exposing portion may be modified to have one of the configurations of the exposing portion described in the second to fourth preferred embodiments, for example.

Sixth Preferred Embodiment

Figure 6A:
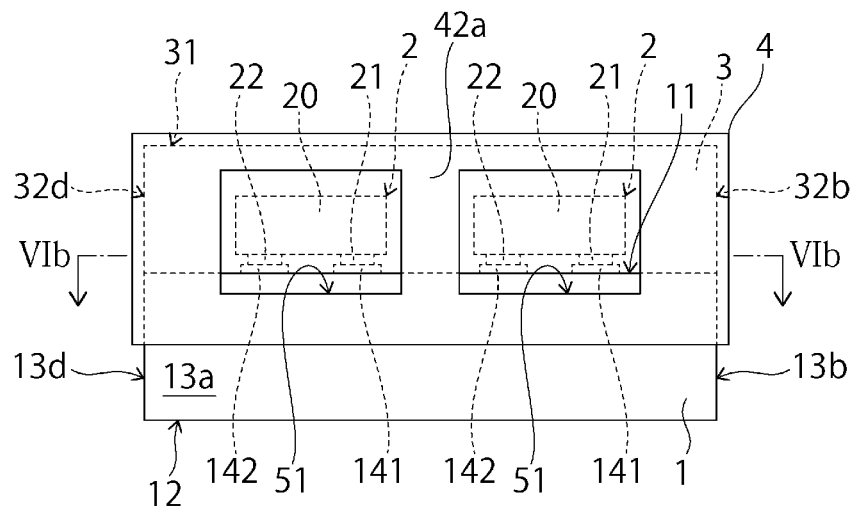
FIG. 6A is a conceptual front view of a high frequency module according to a sixth preferred embodiment of the present invention.
Figure 6B:
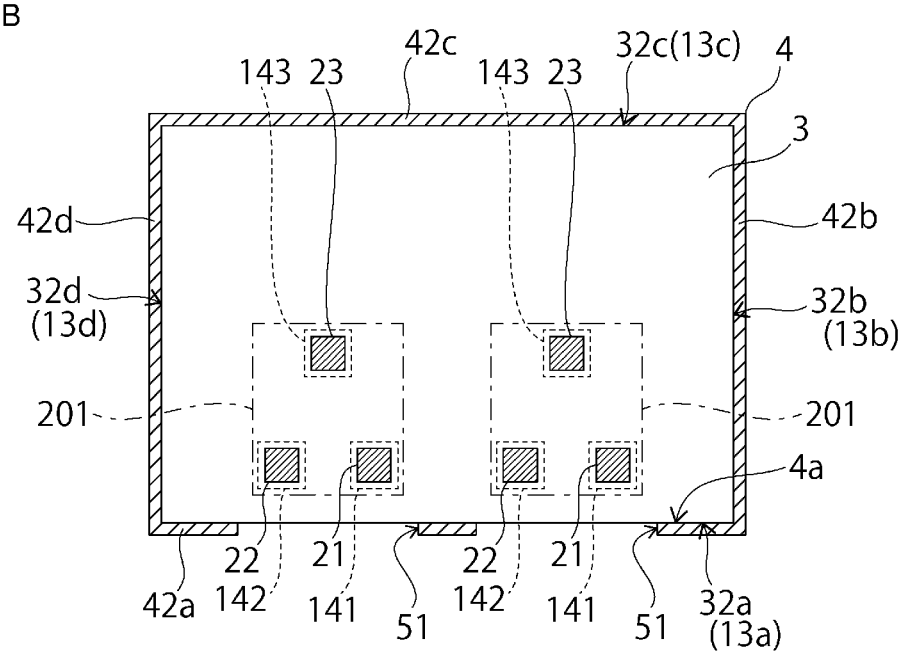
FIG. 6B is a horizontal sectional view taken along a line VIb-VIb in FIG. 6A.

FIG. 6A is a conceptual front view of a high frequency module according to a sixth preferred embodiment of the present invention, and FIG. 6B is a horizontal sectional view taken along a line VIb-VIb in FIG. 6A. As illustrated in FIGS. 6A and 6B, a plurality of mountable elements 2 may be mounted to the mounting surface 11 of the insulating substrate 1, and those mountable elements 2 may be covered with the shield conductor 4. In the present preferred embodiment, two mountable elements 2 are disposed in the same or substantially the same orientation as that of the mountable element 2 described in the first preferred embodiment near the lateral portion 42a of the shield conductor 4 side by side along the lateral portion 42a.

In the above-described structure, preferably, the opening 51 described in the first preferred embodiment is provided in a plural number in the lateral portion 42a of the shield conductor 4 corresponding to the mountable elements 2 in a one-to-one relationship.

In the high frequency module according to the present preferred embodiment, the propagation of the spurious radiation is less likely to be generated between each of the mountable elements 2 and the shield conductor 4. Thus, the propagation of the spurious radiation (mainly the leakage signal from the transmission terminal 21) through the shield conductor 4 is less likely to be generated between the transmission terminal 21 and the reception terminal 22 in each of the mountable elements 2. Furthermore, the propagation of the spurious radiation through the shield conductor 4 is less likely to be generated between the mountable elements 2.

With the high frequency module according to the sixth embodiment, as described above, the propagation of the spurious radiation through the shield conductor 4 is prevented with high efficiency. As a result, high isolation characteristics are achieved in the high frequency module.

The high frequency module according to the present preferred embodiment may be modified such that a portion between the two openings 51 in the shield conductor 4 is not provided, namely that the two openings 51 are joined with each other. With the above structure, the propagation of the spurious radiation between the mountable elements 2 through the shield conductor 4 is prevented with higher efficiency.

The orientation of each of the mountable elements 2 may be modified into one of various orientations including the example described in the fifth preferred embodiment. Furthermore, in the high frequency module according to the sixth preferred embodiment, the opening 51 defining the exposing portion may be modified to have one of the configurations of the exposing portion described in the second to fourth preferred embodiments.

In any of the above-described preferred embodiments of the present invention, the mountable element 2 may be a filter circuit element including, as the first terminal, one of the transmission terminal 21 and the reception terminal 22. Also in such a case, preferably, the shield conductor 4 includes the exposing portion that is provided therein such that the shield conductor 4 is not overlapped with the transmission terminal 21 or the reception terminal 22 when viewed from the predetermined direction. As a result, the propagation of the spurious radiation is less likely to be generated between the filter circuit element and the shield conductor 4. The filter circuit element may further include the common terminal 23 as the second terminal. In such a case, preferably, the exposing portion is provided such that the shield conductor 4 is not overlapped with the common terminal 23 as well when viewed from the predetermined direction.

Moreover, the configurations of individual components in the high frequency modules according to preferred embodiments of the present invention may be further applied to a high frequency module not including the molded resin 3.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high frequency module comprising:
   an insulating substrate;
   a mountable element mounted to a surface of the insulating substrate and including a first terminal for mounting; and
   a shield conductor covering the mountable element in a spaced relationship to the mountable element; wherein
   an exposing portion at which at least the first terminal is exposed is provided in the shield conductor;
   a linear distance from the first terminal to the exposing portion is shorter than a linear distance from the first terminal to the shield conductor; and
   the exposing portion is provided such that a lateral portion of the shield conductor does not overlap with the first terminal when viewed from a direction that is perpendicular or substantially perpendicular to a lateral surface of the insulating substrate.

2. The high frequency module according to claim 1, wherein
   the mountable element is a filter circuit element including a transmission terminal; and
   the first terminal is the transmission terminal.

3. The high frequency module according to claim 1, wherein
   the mountable element is a demultiplexing circuit element including a transmission terminal and a reception terminal; and
   the first terminal is one of the transmission terminal and the reception terminal.

4. The high frequency module according to claim 1, wherein the exposing portion is overlapped with the first terminal when viewed from a front.

5. The high frequency module according to claim 4, wherein
   the mountable element further includes a second terminal for mounting; and
   the exposing portion is overlapped with both of the first terminal and the second terminal when viewed from the front.

6. The high frequency module according to claim 5, wherein the mountable element is a filter circuit element including a common terminal, and the second terminal is the common terminal.

7. The high frequency module according to claim 5, wherein
   the mountable element is a demultiplexing circuit element including a transmission terminal, a reception terminal, and a common terminal; and
   the first terminal and the second terminal are any two among the transmission terminal, the reception terminal, and the common terminal.

8. The high frequency module according to claim 4, wherein the exposing portion is also overlapped with an element body of the mountable element when viewed from front.

9. The high frequency module according to claim 1, wherein the exposing portion includes an opening or a slit provided in the shield conductor.

10. The high frequency module according to claim 1, wherein
a plurality of the mountable elements are mounted to the insulating substrate, the plurality of the mountable elements being covered with the shield conductor; and
a plurality of the exposing portions are provided in the shield conductor corresponding to the plurality of mountable elements, respectively.

11. The high frequency module according to claim 1, further comprising a molded resin covering an entirety or substantially an entirety of a mounting surface of the insulating substrate.

12. The high frequency module according to claim 11, wherein the molded resin also covers an entirety of substantially an entirety of the mountable element.

13. The high frequency module according to claim 11, wherein the shield conductor is disposed on an upper surface of the molded resin.

14. A high frequency module comprising:
an insulating substrate;
a mountable element mounted to a surface of the insulating substrate, the mountable element being a demultiplexing circuit element including a transmission terminal, a reception terminal, and a common terminal; and
a shield conductor covering the mountable element in a spaced relationship to the mountable element; wherein
the transmission terminal and the reception terminal are arranged nearer to the shield conductor than the common terminal; and
an exposing portion is provided in a portion of the shield conductor overlapped with at least the transmission terminal and the reception terminal.

15. The high frequency module according to claim 14, wherein the exposing portion is also overlapped with an element body of the mountable element when viewed from front.

16. The high frequency module according to claim 14, wherein the exposing portion includes an opening or a slit provided in the shield conductor.

17. The high frequency module according to claim 14, wherein
a plurality of the mountable elements are mounted to the insulating substrate and covered with the shield conductor; and
a plurality of the exposing portions are provided in the shield conductor corresponding to the plurality of mountable elements, respectively.

18. The high frequency module according to claim 14, further comprising a molded resin covering an entirety or substantially an entirety of a mounting surface of the insulating substrate.

19. The high frequency module according to claim 18, wherein the molded resin also covers an entirety of substantially an entirety of the mountable element.

20. The high frequency module according to claim 18, wherein the shield conductor is disposed on an upper surface of the molded resin.

* * * * *